United States Patent
Shibata

(10) Patent No.: US 9,979,415 B2
(45) Date of Patent: May 22, 2018

(54) DATA COMPRESSION APPARATUS, DATA DECOMPRESSION APPARATUS, DATA COMPRESSION METHOD, DATA COMPRESSION METHOD, AND COMPUTER READABLE MEDIUM

(71) Applicant: Mitsubishi Electric Corporation, Tokyo (JP)

(72) Inventor: Hideya Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/536,030

(22) PCT Filed: Feb. 16, 2015

(86) PCT No.: PCT/JP2015/054125
§ 371 (c)(1),
(2) Date: Jun. 14, 2017

(87) PCT Pub. No.: WO2016/132430
PCT Pub. Date: Aug. 25, 2016

(65) Prior Publication Data
US 2017/0338834 A1    Nov. 23, 2017

(51) Int. Cl.
*H03M 7/30*    (2006.01)
*H03M 7/46*    (2006.01)

(52) U.S. Cl.
CPC ........... *H03M 7/6017* (2013.01); *H03M 7/30* (2013.01); *H03M 7/46* (2013.01)

(58) Field of Classification Search
CPC ......... H03M 7/6017; H03M 7/30; H03M 7/46
(Continued)

(56) References Cited

U.S. PATENT DOCUMENTS 4,488,143 A * 12/1984 Martin ............... G11B 20/1426
341/59
5,179,711 A * 1/1993 Vreeland ................... G06F 7/02
341/59
(Continued)

FOREIGN PATENT DOCUMENTS

JP    2004-70120 A    3/2004
JP    2004-258059 A    9/2004
(Continued)

OTHER PUBLICATIONS

Anh et al., "Inverted Index Compression Using Word-Aligned Binary Codes", Information Retrieval, vol. 8, 2005, pp. 151-166.
(Continued)

*Primary Examiner* — Brian Young
(74) *Attorney, Agent, or Firm* — Birch, Stewart, Kolasch & Birch, LLP

(57) ABSTRACT

A data compression apparatus of the invention includes a data acquisition unit to acquire n integers from encoding data, an integer division unit to divide each integer of the n integers into a second integer represented by low-order bits whose number of divided bits is b and a first integer represented by high-order bits obtained by excluding the low-order bits from each integer of the n integers and to output n first integers and n second integers, a first encoding unit to encode and output the n first integers as a first code represented by binary data having a number of bits that is a natural-number times the number of unit bits of L, and a second encoding unit to encode and output the n second integers as a second code.

11 Claims, 8 Drawing Sheets

(58) Field of Classification Search
USPC ..................................................... 341/59, 87
See application file for complete search history.

(56) References Cited

U.S. PATENT DOCUMENTS

| | | | |
|---|---|---|---|
| 5,841,376 A * | 11/1998 | Hayashi | G06T 9/005 341/50 |
| 6,570,511 B1 * | 5/2003 | Cooper | G06T 9/005 341/59 |
| 7,183,950 B2 | 2/2007 | Sugita | |
| 7,430,328 B2 | 9/2008 | Cooley | |
| 7,791,510 B2 | 9/2010 | Maeda | |
| 2006/0115164 A1 | 6/2006 | Cooley | |
| 2006/0176196 A1 | 8/2006 | Sugita | |
| 2009/0109070 A1 | 4/2009 | Maeda | |

FOREIGN PATENT DOCUMENTS

| | | |
|---|---|---|
| JP | 2005-151327 A | 6/2005 |
| JP | 2006-217503 A | 8/2006 |
| JP | 2007-88962 A | 4/2007 |
| JP | 2008-522548 A | 6/2008 |
| JP | 2009-105838 A | 5/2009 |
| JP | 2009-260747 A | 11/2009 |
| JP | 2011-109385 A | 6/2011 |
| JP | 2011-223244 A | 11/2011 |
| JP | 2012-10319 A | 1/2012 |
| JP | 2012-134858 A | 7/2012 |
| JP | 2013-11946 A | 1/2013 |
| JP | 5570409 B2 | 8/2014 |

OTHER PUBLICATIONS

Scholer et al., "Compression of Inverted Indexes For Fast Query Evaluation", In Proc. of the 25th Annual SIGIR Conference on Research and Development in Information Retrieval, Aug. 2002, pp. 1-8.

Zukowski et al., "Super-Scalar RAM-CPU Cache Compression", In. Proc. of the International Conference on Data Engineering, 2006, pp. 1-12.

* cited by examiner

DATA COMPRESSION APPARATUS, DATA DECOMPRESSION APPARATUS, DATA COMPRESSION METHOD, DATA COMPRESSION METHOD, AND COMPUTER READABLE MEDIUM

TECHNICAL FIELD

The present invention relates to a data compression apparatus, a data decompression apparatus, a data compression method, a data decompression method, and a program. More specifically, the invention relates to a data compression apparatus, a data decompression apparatus, a data compression method, a data decompression method, and a program each using a method of performing encoding by dividing an integer.

BACKGROUND ART

As an encoding method for reversibly compressing a fixed-length integer string, a method is used where a predicted value for data to be encoded is first determined, a residual between the predicted value and the data to be encoded is then determined, and a data series constituted from the residual is encoded using an appropriate method. That is, this method is constituted from predicted value generation of determining the predicted value for the data to be encoded, residual generation of determining the residual between the predicted value and the data to be encoded, and residual encoding of encoding the data series constituted from the residual using the appropriate method.

In this method, the data series constituted from a smaller value than an actual data series or a value near 0 is obtained by 0 interposing a stage of determining the residual. Thus, according to this method, the residual encoding with respect to the data to be encoded often easily becomes effective to enhance a compression effect.

There is provided a method of adopting a difference from a last value as the residual, as an example of the predicted value generation and the residual generation. Specifically, the last value is selected as the predicted value, and a simple subtracted value of an integer value is adopted as the residual, as a residual generation method. More generally, a method of linear prediction or the like is selected for the predicted value.

With respect to the residual encoding, various methods such as gamma encoding, delta encoding, and the like have been proposed. These methods of the residual encoding are broadly classified into two types of methods that are a method for compression ratio improvement and a method of improving a processing speed such as a compression speed, a decompression speed, or the like.

As the method for the compression ratio improvement, there is provided a method, as represented by Golomb-Rice coding, in which an integer value is divided into a first integer constituted from high-order bits and a second integer constituted from low-order bits at a defined position. Hereinafter, the encoding method of dividing an integer will be collectively referred to as a high- and low-order bits division method.

In the high- and low-order bits division method, the first integer constituted from the high-order bits is encoded by appropriate variable length encoding such as the gamma encoding or the delta encoding, and is then output. Then, the second integer constituted from the low-order bits is not encoded and is output as fixed-length binary data. In the Golomb-Rice coding, alpha coding is adopted as the encoding method of the first integer.

Patent Literature 1 discloses a method of enhancing a compression ratio by dynamically determining an encoding method of a first integer constituted from high-order bits and a dividing position of the high-order bits and low-order bits. Patent Literature 2 discloses an image compression method using the high- and low-order bits division method.

The high- and low-order bits division method is an effective method when a variation in the low-order bits is large because noise is mixed in an integer string to be compressed or the like. The basic concept of the high- and low-order bits division method is as follows. That is, since it is difficult to compress the low-order bits with the noise mixed therein, the low-order bits are output as the fixed-length binary data without being compressed. Then, only the high-order bits that are comparatively easy to compress are compressed.

When an integer string is bit-divided into high-order bits and low-order bits as illustrated in FIG. 8, the high-order bits become easy to compress and the low-order bits become difficult to compress.

As the method for improving the processing speed, there are a plurality of methods of performing encoding at a time of compression by increments of one byte or increments of one word which is further larger than the one byte. In the gamma encoding, the delta encoding, the Golomb-Rice encoding, or the like described before, a code is generated and output bit by bit. Thus, there is a problem that compatibility with computer processing is low, leading to reduction of a processing speed. A method that has been proposed in order to solve such a problem is a method of generating a code byte by byte or word by word and outputting the code. Herein, a word is a unit of a fixed length, and indicates the unit of 2 bytes or 4 bytes, for example. Hereinafter, the compression methods of generating the code byte by byte and word by word will be respectively referred to as a byte-based processing method and a word-based processing method.

As an example of the byte-based processing method, an encoding method such as Variable-Byte (Non-Patent Literature 1) is well known. As the word-based processing method, Simple9 (Non-Patent Literature 2), PForDelta (Non-Patent Literature 3), and so on are well known. In the gamma encoding, the delta encoding, the Golomb-Rice coding, and so on, integers are encoded one by one. In the word-based encoding method, a plurality of integers are collectively encoded, and a result of the encoding is generated word by word.

CITATION LIST

Patent Literature

Patent Literature 1: JP 5570409
Patent Literature 2: JP 2011-223244

Non-Patent Literature

Non-Patent Literature 1: F. Scholer, H. Williams, J. Yiannis, and J. Zobel, Compression of Inverted Indexes For Fast Query Evaluation. In Proc. of the 25th Annual SIGIR Conf. on Research and Development in Information Retrieval, August 2002.
Non-Patent Literature 2: Vo Ngoc Anh, Alistair Moffat. Inverted Index Compression Using Word-Aligned Binary Codes, Information Retrieval, 8, 151-166, 2005.

Non-Patent Literature 3: M. Zukowski, S. Heman, N. Nes, and P. Boncz. Super-Scalar RAM-CPU Cache Compression. In Proc. of the Int. Conf. on Data Engineering, 2006.

SUMMARY OF INVENTION

Technical Problem

The compression ratio and the processing speed are in a trade-off relationship. In the high- and low-order bits division method, the compression ratio is improved, but the processing speed is reduced. On the other hand, in the word-based processing method, the processing speed is improved, but the compression ratio is reduced.

An object of the present invention is to implement a reversible compression method of an integer string capable of improving a processing speed while maintaining a high compression ratio using a high- and low-order bits division method, by making the high- and low-order bits division method and a word-based processing method compatible with each other.

Solution to Problem

A data compression apparatus according to the present invention may include:

a data acquisition unit to acquire n integers from encoding data including a plurality of integers each represented by binary data having a number of unit bits being a number of bits for each process, wherein n is a natural number;

an integer division unit to divide each integer of the n integers acquired by the data acquisition unit into a second integer represented by low-order bits having a number of divided bits and a first integer represented by high-order bits obtained by excluding the low-order bits from each integer of the n integers and to output n first integers and n second integers;

a first encoding unit to encode the n first integers output from the integer division unit and to output a result of the encoding of the n first integers as a first code represented by binary data having a number of bits that is a natural-number times the number of unit bits; and a second encoding unit to encode the n second integers output from the integer division unit and to output a result of the encoding of the n second integers as a second code.

Advantageous Effects of Invention

The data compression apparatus according to the present invention includes the first encoding unit to encode the n first integers output from the integer division unit and to output the result of the encoding of the n first integers as the first code represented by the binary data having the number of bits that is the natural-number times the number of unit bits. The data compression apparatus also includes the second encoding unit to encode the n second integers output from the integer division unit and to output the result of the encoding of the n second integers as the second code. Thus, according to the data compression apparatus of the present invention, the high- and low-bits division method and the word-based processing methods are made compatible with each other, thereby allowing improvement of a processing speed while maintaining a compression ratio to be high.

DESCRIPTION OF EMBODIMENTS

First Embodiment

*Description of Configuration*

Figure 1:
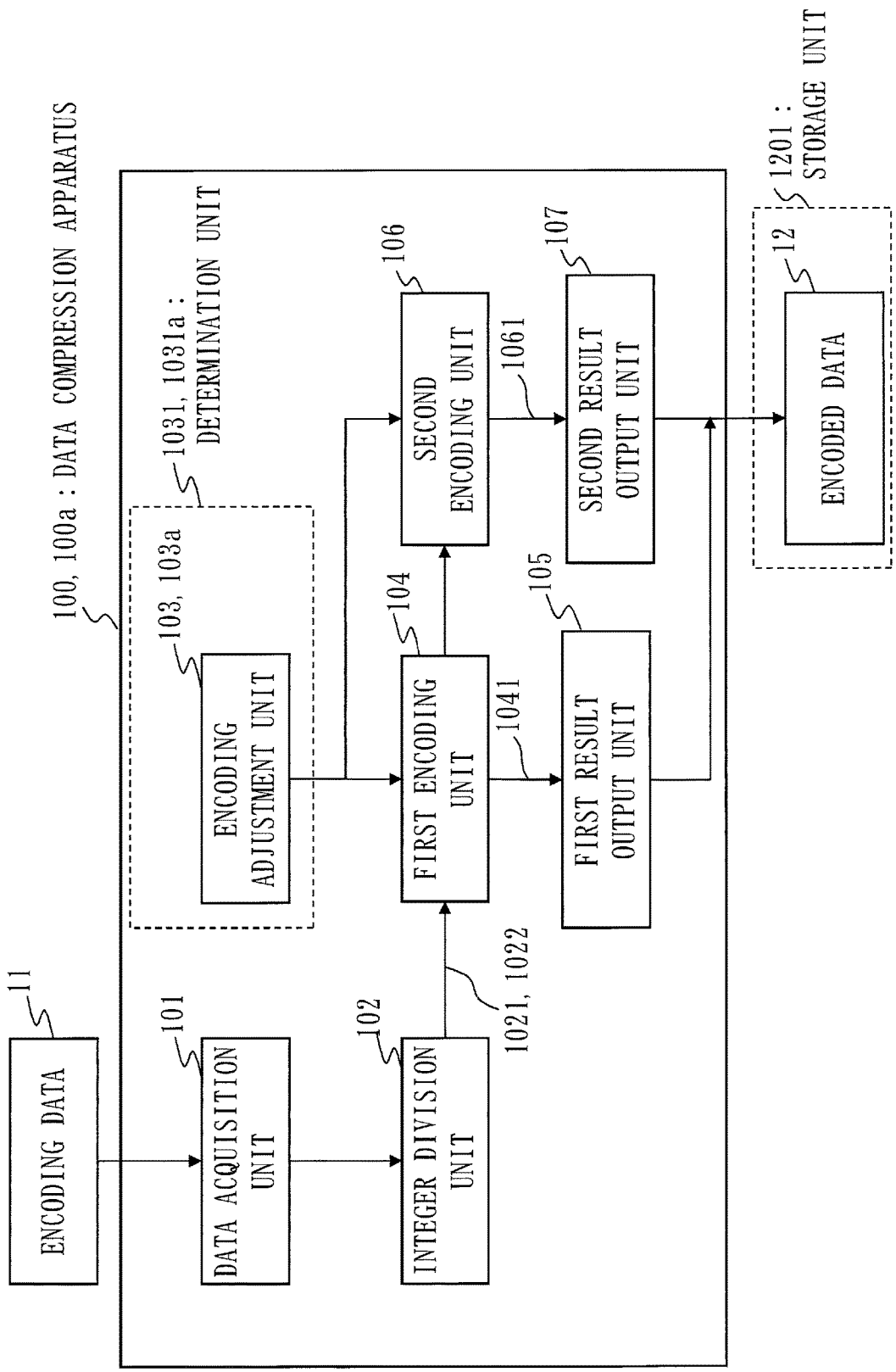
FIG. 1 is a block configuration diagram of a data compression apparatus according to a first embodiment.

A block configuration of a data compression apparatus 100 according to this embodiment will be described, using FIG. 1.

In the following description, the number of unit bits, which is the number of bits for each process is set to L bits. The number of unit bits is also referred to as a word or a byte. The number of unit bits is also referred to as a word unit that is the length of the word.

The bit length of binary data representing an integer is set to L bits, being equal to the number of unit bits. L is a value such as 16, 32, or 64, but is not limited to these values. This embodiment may be applied to an integer of an arbitrary bit length.

The data compression apparatus 100 acquires encoding data 11 to be encoded, encodes the encoding data 11 acquired, and stores a result of the encoding in encoded data 12. The encoding data 11 is a string of integers that are placed in order. The number of the integers included in the encoding data 11 is arbitrary. The encoding data 11 is also referred to as input data.

The data compression apparatus 100 includes a data acquisition unit 101, an integer division unit 102, an encoding adjustment unit 103, a first encoding unit 104, a first result output unit 105, a second encoding unit 106, and a second result output unit 107. A storage unit 1201 is connected to the data compression apparatus 100. The encoded data 12 is stored in the storage unit 1201.

The data acquisition unit 101 loads the integers included in the encoding data 11. The data acquisition unit 101 acquires n integers (in which the n is a natural number) from the encoding data 11 including the integers each represented by binary data having the number of unit bits that is the number of bits for each process. The data acquisition unit 101 is also referred to as an input unit.

The integer division unit 102 divides each of the integers acquired by the data acquisition unit 101 into a first integer 1021 constituted from high-order (L−b) bits and a second integer 1022 constituted from low-order b bits, based on a bit dividing position parameter b. That is, the integer division unit 102 divides each integer of the n integers acquired by the data acquisition unit 101. The integer division unit 102 divides each integer of the n integers into the second integer 1022 represented by the low-order bits whose number of divided bits is b and the first integer 1021 represented by the high-order bits obtained by excluding the low-order bits from each integer of the n integers. Then, the integer division unit 102 outputs n first integers and n second integers.

The encoding adjustment unit 103 determines the number n of the integers to be encoded all at once. The encoding adjustment unit 103 is also referred to as a determination unit 1031 or an encoding unit adjustment unit. The determination unit 1031 or the encoding adjustment unit 103 determines, as the n, the number that is k times the number of unit bits of the L in which the k is a natural number.

The first encoding unit 104 encodes the n first integers 1021 output from the integer division unit 102. The first encoding unit 104 outputs a result of the encoding of the n first integers 1021 as a first code 1041 represented by binary data having the number of bits that is a natural-number times the number of unit bits of the L.

The first encoding unit 104 encodes the n first integers 1021 determined by the encoding adjustment unit 103. The first encoding unit 104 uses the word-based processing method such as Simple9 for the encoding, in which a result of encoding is generated word by word. The first encoding unit 104 outputs the first code 1041 obtained by encoding the n first integers 1021. The data size of the first code 1041 to be output from the first encoding unit 104 is the multiple of the L bits that constitute the word unit, due to the property of the first encoding unit 104. The first encoding unit 104 is also referred to as a first integer encoding unit.

The first result output unit 105 adds the first code 1041 generated by the first encoding unit 104 to the encoded data 12. The first result output unit 105 is also referred to as a first encoded result output unit.

The second encoding unit 106 encodes the n second integers 1022 determined by the encoding adjustment unit 103, for output as a second code 1061. That is, the second encoding unit 106 encodes the n second integers 1022 output from the integer division unit 102, and outputs a result obtained by encoding the n second integers 1022, as the second code 1061.

The second code 1061 is represented by binary data having the number of bits obtained by multiplying the number of divided bits of the b by the n. That is, the second encoding unit 106 generates fixed-length binary data of n×b bits from the n integers of the b bits. The second encoding unit 106 is also referred to as a second integer encoding unit.

In this case, depending on the value of the n, the result of the encoding by the second encoding unit 106 is not generated on a word basis. That is, the number of the bits of the (n×b) of the second code 1061 may not become a multiple of the L. However, according to this embodiment, by appropriately selecting the n by the encoding adjustment unit 103, the number of the bits of the second code 1061 may be generated on the word basis, or may be generated as a natural-number times the L. Since the encoding adjustment unit 103 determines the n so that n=L×k, the second encoding unit 106 may output the second code 1061 represented by the binary data having the number of bits obtained by multiplying the number of unit bits of the L by a product between the number of divided bits of the b and the k.

The second result output unit 107 adds the second code 1061 generated by the second encoding unit 106 to the encoded data 12. According to this embodiment, the data size of the second code 1061 to be output becomes the multiple of the word unit of the L bits due to the property of the second encoding unit 106. The second result output unit 107 is also referred to as a second encoded result output unit.

The storage unit 1201 stores the first code 1041 output by the first encoding unit 104 and also successively stores the second code 1061 output by the second encoding unit 106 after the first code 1041. As mentioned above, the first code 1041 and the second code 1061 are successively and alternately described in the encoded data 12 stored in the storage unit 1201.

Now, details of the encoding adjustment unit 103 will be described.

The encoding adjustment unit 103 selects the multiple (k×L) of the L of the word unit, as the n that is the number of the integers to be encoded all at once. Herein, the k is a parameter determined by a user of the data compression apparatus 100 in advance.

By setting the n so that the n=k×L by the encoding adjustment unit 103, the size of the second code 1061 to be generated by the second encoding unit 106 becomes (k×L×b) bits, or the multiple of the word unit of the L bits. Accordingly, the second result output unit 107 may output the second code 1061 having the size of the multiple of the word unit of the L bits, without consuming an unnecessary bit space.

A block configuration of the data decompression apparatus 200 according to this embodiment will be described, using FIG. 2.

The data decompression apparatus 200 is an apparatus to decompress the encoded data 12 encoded by the data compression apparatus 100 and including the first code 1041 and the second code 1061. The data decompression apparatus 200 receives the encoded data 12 and outputs the encoding data 11 that is original data 22 before compressed by the data compression apparatus 100.

The data decompression apparatus 200 includes an encoded data acquisition unit 201, a first decoding unit 202, a second decoding unit 204, an integer combining unit 205, and an output unit 206. The first decoding unit 202 includes a first decoding process unit 2021 and a finish determination unit 203.

The encoded data acquisition unit 201 loads, from the encoded data 12, the data to be decoded. As mentioned above, the encoded data 12 includes the first code 1041 and the second code 1061 that have been alternately described. Accordingly, the encoded data acquisition unit 201 alternately loads the first code 1041 and the second code 1061. The encoded data acquisition unit 201 is also referred to as an input unit.

The first decoding unit 202 decodes the first code 1041 loaded from the encoded data 12 into a plurality of the first integers 1021. That is, the first decoding unit 202 acquires the first code 1041 and decodes the acquired first code 1041 into the n first integers 1021. The first decoding unit 202 may perform the decoding process using the word unit of the L bits, due to the property of the data compression apparatus 100. The first decoding unit 202 is also referred to as a first integer decoding unit.

The first decoding process unit 2021 executes the decoding process of the first integers with respect to one word of the first code 1041 acquired from the encoded data acquisition unit 201.

The finish determination unit 203 corresponds to the encoding adjustment unit 103 in the data compression apparatus 100. The finish determination unit 203 determines whether or not decoding of the n first integers just corresponding to the number n of the integers to be compressed all at once, which was set by the encoding adjustment unit 103, has been finished. If the decoding of the n first integers has not been finished, the finish determination unit 203 still performs the decoding process of the first integers by the first decoding process unit 2021. If the decoding of the n first integers has been finished, the finish determination unit 203 transitions to a decoding process of the second integers. The finish determination unit 203 is also referred to as a first integer decoding process finish determination unit.

The second decoding unit 204 decodes the second code 1061 loaded from the encoded data 12 into a plurality of the second integers. That is, the second decoding unit 204 acquires the second code 1061 from the encoded data 12, and decodes the acquired second code 1061 into the n second integers 1022. The second decoding unit 204 may perform the decoding process on the word basis, due to the property of the data compression apparatus 100. The second decoding unit 204 is referred to as a second integer decoding unit.

The integer combining unit 205 recombines and decodes the decoded first integers and the decoded second integers into original integer data. That is, the integer combining unit 205 generates the n integers, based on the n first integers 1021 and the n second integers 1022.

The output unit 206 outputs a result of the decoding obtained by the integer combining unit 205 as the original data 22. The original data 22 is the encoding data 11 before encoded.

An example of a hardware configuration of each of the data compression apparatus 100 and the data decompression apparatus 200 according to this embodiment will be described, using FIG. 3.

Each of the data compression apparatus 100 and the data decompression apparatus 200 is a computer.

Each of the data compression apparatus 100 and the data decompression apparatus 200 includes hardware such as a processor 901, an auxiliary storage device 902, a memory 903, a communication device 904, an input interface 905, and a display interface 906.

The processor 901 is connected to the other hardware via a signal line 910, and controls these other hardware.

The input interface 905 is connected to an input device 907.

The display interface 906 is connected to a display 908.

The processor 901 is an IC (Integrated Circuit) to perform processing.

The processor 901 is a CPU (Central Processing Unit), a DSP (Digital Signal Processor), or a GPU (Graphics Processing unit), for example.

The auxiliary storage device 902 is a ROM (Read Only Memory), a flash memory, or an HDD (Hard Disk Drive), for example.

The memory 903 is a RAM (Random Access Memory), for example.

The communication device 904 includes a receiver 9041 to receive data and a transmitter 9042 to transmit data.

The communication device 904 is a communication chip or an NIC (Network Interface Card), for example.

The input interface 905 is a port to which a cable 911 of the input device 907 is connected.

The input interface 905 is a USB (Universal Serial Bus) terminal, for example.

The display interface 906 is a port to which a cable 912 of the display 908 is connected The display interface 906 is a USB terminal or an HDMI (registered trademark) (High Definition Multimedia Interface) terminal, for example.

The input device 907 is a mouse, a keyboard, or a touch panel, for example.

The display 908 is an LCD (Liquid Crystal Display), for example.

When the computer is the data compression apparatus 100, a program to implement functions of the data acquisition unit 101, the integer division unit 102, the encoding adjustment unit 103, the first encoding unit 104, the first result output unit 105, the second encoding unit 106, and the second result output unit 107 illustrated in FIG. 1 is stored in the auxiliary storage device 902. Hereinafter, the data acquisition unit 101, the integer division unit 102, the encoding adjustment unit 103, the first encoding unit 104, the first result output unit 105, the second encoding unit 106, and the second result output unit 107 will be collectively written as a "data compression apparatus unit".

Figure 2:
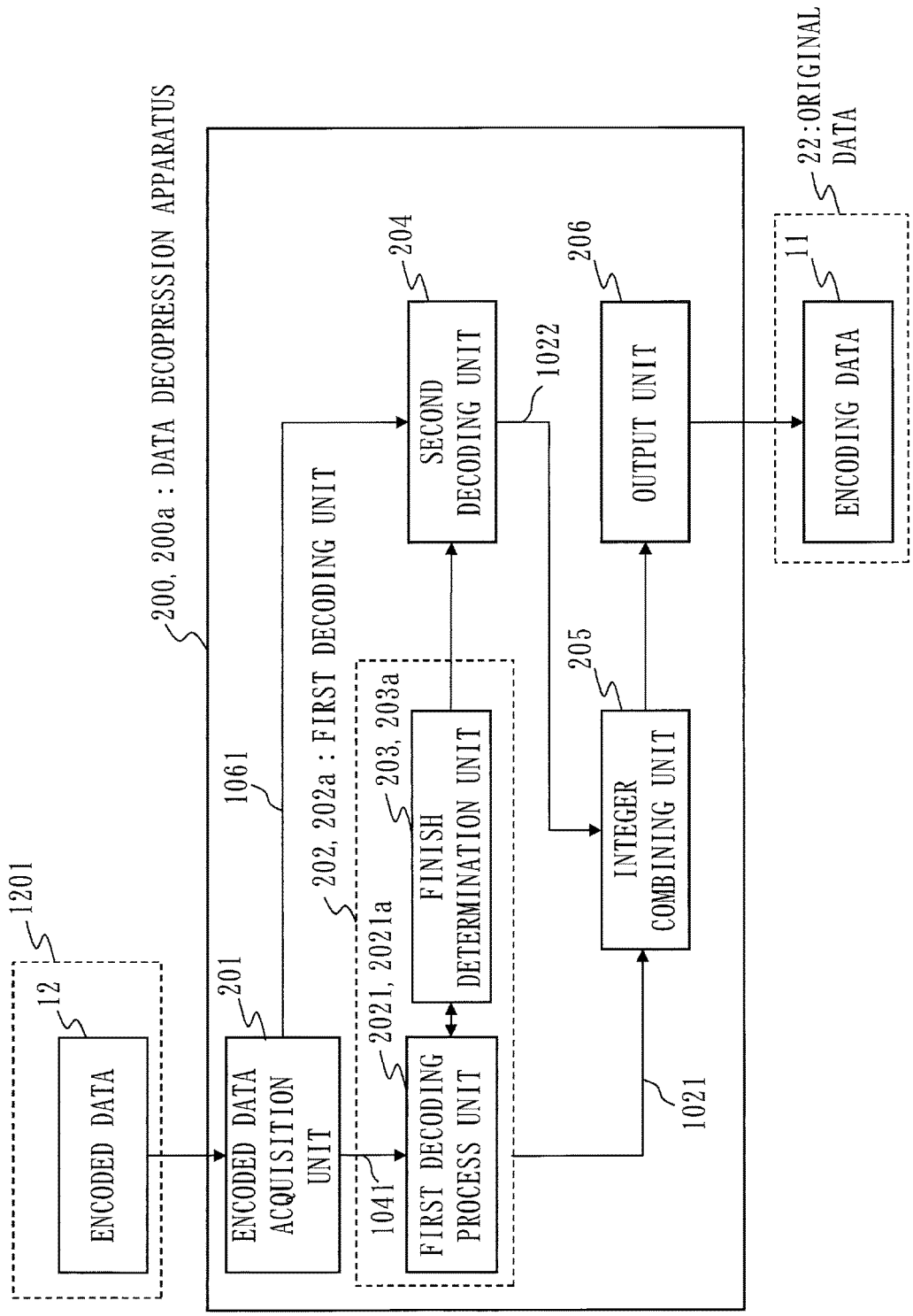
FIG. 2 is a block configuration diagram of a data decompression apparatus according to the first embodiment.

When the computer is the data decompression apparatus 200, a program to implement functions of the encoded data acquisition unit 201, the first decoding process unit 2021, the finish determination unit 203, the second decoding unit 204, the integer combining unit 205, and the output unit 206 illustrated in FIG. 2 is stored in the auxiliary storage device 902. Hereinafter, the encoded data acquisition unit 201, the first decoding process unit 2021, the finish determination unit 203, the second decoding unit 204, the integer combining unit 205, and the output unit 206 will be collectively written as a "data decompression apparatus unit". One or both of the "data compression apparatus unit" and the "data decompression apparatus unit" may be simply written as a "unit".

The program to implement the functions of the "data compression apparatus unit" mentioned above is also referred to as a data compression program. The program to implement the functions of the "data decompression apparatus unit" mentioned above is also referred to as a data decompression program. The program to implement the functions of the "unit" may be constituted from one program or a plurality of the programs.

This program is loaded into the memory 903, is read into the processor 901, and is executed by the processor 901.

An OS (Operating System) is also stored in the auxiliary storage device 902.

At least a part of the OS is loaded into the memory 903, and the processor 901 executes the program to implement the functions of the "unit" while executing the OS.

Figure 3:
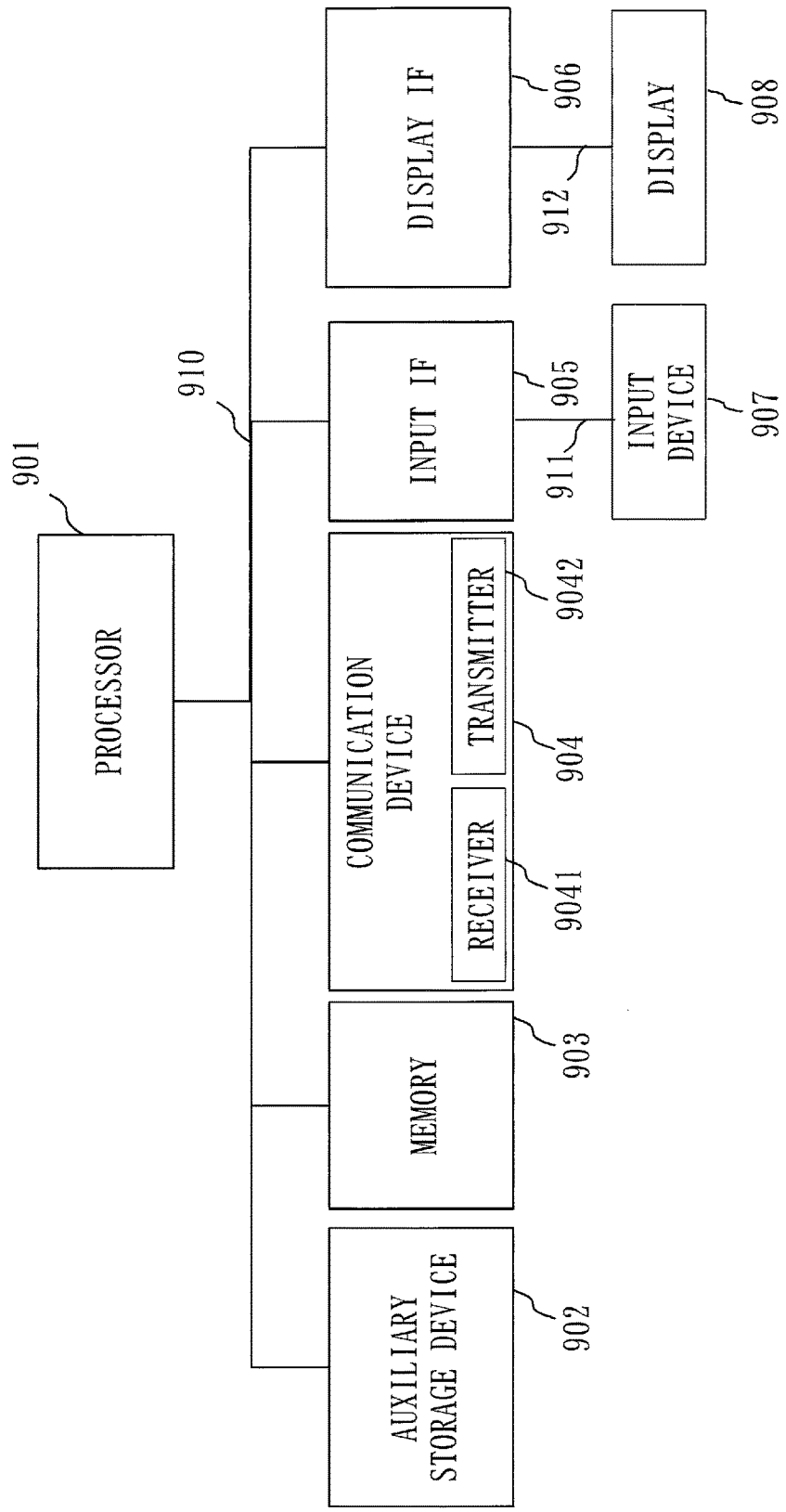
FIG. 3 is a hardware configuration diagram of each of the data compression apparatus and the data decompression apparatus according to the first embodiment.

Though one processor 901 is illustrated in FIG. 3, it may be so configured that each of the data compression apparatus 100 and the data decompression apparatus 200 includes a plurality of the processors 901.

Then, the plurality of the processors 901 cooperate and execute the program to implement the functions of the "unit".

Information, data, signal values, and variable values indicating results of processes by the "unit" are stored in the memory 903, the auxiliary storage device 902, a register or a cache memory in the processor 901, as files.

The "unit" may be provided as "circuitry".

The "unit" may be read as a "circuit", a "step", a "procedure", "or a "process". The process may be read as a "circuit", a "step", a "procedure", or a "unit".

The "circuit" and the "circuitry" are each a concept including not only the processor 901, but also a processing circuit of a different type such as a logic IC, a GA (Gate Array), an ASIC (Application Specific Integrated Circuit), or an FPGA (Field-Programmable Gate Array).

A program product is a storage medium or a storage device in which the program to implement the functions described as the "unit" is stored, and is a product of any appearance in which a computer readable program is loaded.

\*\*\*Description of Operations\*\*\*

Operations of a data compression method or a data compression process S100 of the data compression apparatus 100 according to this embodiment will be described, using FIG. 4.

<Data Acquisition Process S1001>

The data acquisition unit 101 executes a data acquisition process S1001 of acquiring n integers from the encoding data 11 including a plurality of integers each represented by binary data whose number of unit bits is the L, in which the n is the natural number. The data acquisition process S1001 includes a process in S101 and a process in S102.

In S101, the data acquisition unit 101 determines whether an encoding process of every integer included in the encoding data 11 has been completed.

If the data acquisition unit 101 has determined that the encoding process of the every integer included in the encoding data 11 has been completed, the procedure is finished. If the data acquisition unit 101 has determined that the encoding process of the every integer included in the encoding data 11 has not been completed, the procedure proceeds to S102.

In S102, the data acquisition unit 101 loads from the encoding data 11 the integers to be newly encoded. In this case, the data acquisition unit 101 loads (k×L) integers or the n integers according to the parameter k determined by the encoding adjustment unit 103. When only the integers of less than the (k×L) remain in the encoding data 11, the data acquisition unit 101 loads all of the integers. The procedure proceeds to S103.

<Integer Division Process S1002>

The integer division unit 102 executes an integer division process S1002 of dividing each integer of the n integers acquired in the data acquisition process S1001. In the integer division process S1002, the integer division unit 102 divides each integer of the n integers into a second integer 1022 represented by low-order bits whose number of divided bits is b and a first integer 1021 represented by high-order bits obtained by excluding the low-order bits from each integer of the n integers. In the integer division process S1002, the integer division unit 102 outputs n first integers 1021 and n second integers 1022. The integer division process S1002 includes a process in S103.

In S103, the integer division unit 102 divides the loaded (k×L) integers into the first integers 1021 each constituted from the high-order bits of (L−b) bits and the second integers 1022 each constituted from the low-order bits of b bits. The procedure proceeds to S104.

<First Encoding Process S1003>

The first encoding unit 104 executes a first encoding process S1003 of encoding the n first integers 1021 output in the integer division process S1002. In the first encoding process S1003, the first encoding unit 104 outputs a result of the encoding of the n first integers 1021 as a first code 1041 represented by binary data having the number of bits that is the natural-number times the number of unit bits of the L. The first encoding process S1003 includes a process in S104 and a process in S105.

In S104, the first encoding unit 104 encodes the (k×L) first integers using the word-based processing method to generate the first code 1041. The procedure proceeds to S105.

In S105, the first result output unit 105 adds the first code 1041 generated by the first encoding unit 104 to the encoded data 12. The procedure proceeds to S106.

<Second Encoding Process S1004>

The second encoding unit 106 executes a second encoding process S1004 of encoding the n second integers 1022 output in the integer division process S1002 and outputting a result of the encoding of the n second integers 1022 as a second code 1061. The second encoding process S1004 includes a process in S106 and a process in S107.

In S106, the second encoding unit 106 encodes the (k×L) second integers into fixed-length binary data of (k×L×b) bits or (n×b) bits to generate the second code 1061. The procedure proceeds to S107.

In S107, the second result output unit 107 adds the second code 1061 generated by the second encoding unit 106 to the encoded data 12. The procedure returns to S101.

The description of the data compression method or the data compression process S100 of the data compression apparatus 100 will be finished by the above description.

The plurality of the integers included in the encoding data 11 are output as the encoded data 12 by this data compression method. The first code 1041 obtained by encoding the n first integers 1021 and the second code 1061 obtained by encoding the n second integers 1022 are alternately described in the encoded data 12.

Subsequently, a data decompression method or a data decompression process S200 of the data decompression apparatus 200 according to this embodiment will be described, using FIG. 5.

<Encoded Data Acquisition Process S2001>

In S201, the encoded data acquisition unit 201 determines whether a decoding process of every data included in the encoded data 12 has been completed. If the encoded data acquisition unit 201 has determined that the decoding process of the every data has been completed, the procedure is finished. If the encoded data acquisition unit 201 has determined that the decoding process of the every data has not been completed, the procedure proceeds to S202.

In S202, the encoded data acquisition unit 201 determines whether a subsequent process is a first integer decoding process or a second integer decoding process. An initial state in the data decompression process S200 is the first integer decoding process. If the subsequent process is the first integer decoding process, the procedure proceeds to S203. If the subsequent process is the second integer decoding process, the procedure proceeds to S208.

<First Decoding Process S2002>

The first decoding unit 202 executes a first decoding process S2002 of acquiring the first code 1041 included in the encoded data 12 obtained by the encoding by the data compression process S100 and decoding the first code 1041 into the n first integers 1021.

The first decoding unit 202 sequentially acquires from the first code 1041 first unit data 10411 that is binary data whose number of unit bits is the L, decodes the first unit data 10411 acquired, and counts the number of the first integers 1021 obtained by the decoding. The first decoding unit 202 repeats processes of acquiring the first unit data 10411 from the first code 1041, and decoding the acquired first unit data 10411 until a counted number equals to the n. The first decoding process S2002 includes processes in S203 to S207.

In S203, the encoded data acquisition unit 201 loads from the encoded data 12 the one word of the data to be newly decoded. The one word is constituted from L bits. The procedure proceeds to S204.

In S204, the first decoding process unit 2021 of the first decoding unit 202 decodes the loaded one word into a plurality of the first integers 1021. The procedure proceeds to S205.

In S205, the finish determination unit 203 of the first decoding unit 202 determines whether or not the n (=k×L) first integers have been decoded by the first decoding process unit 2021. That is, the finish determination unit 203 determines whether or not the number of the first integers decoded is the n. If the n first integers have been decoded, the procedure proceeds to S206. If the decoding of the n first integers has been uncompleted, the procedure proceeds to S207.

In S206, the finish determination unit 203 sets a process to be subsequently performed to the second integer decoding process. This setting is used for the determination in S202. The finish determination unit 203 initializes the number of the decoded first integers to be used for the determination in S205 to 0. The procedure returns to S202.

In S207, the finish determination unit 203 sets a process to be subsequently performed to the first integer decoding process. This setting is used for the determination in S202. The procedure returns to S202.

The n (=k×L) first integers are generated by the above-mentioned first decoding process S2002.

<Second Decoding Process S2003>

The second decoding unit 204 executes a second decoding process S2003 of acquiring the second code 1061 from the encoded data 12 and decoding the acquired second code 1061 into the n second integers 1022.

The second decoding unit 204 acquires the number of second unit data 10611 that is binary data whose number of unit bits is the L, just corresponding to the number of a product between the number of divided bits of the b and the k. The second decoding unit 204 decodes the number of the second unit data 10611 corresponding to the number of the product between the number of divided bits of the b and the k into the n second integers 1022. The second decoding process S2003 includes processes from S208 to S209.

In S208, the encoded data acquisition unit 201 loads from the encoded data 12 the (k×b) words of the data to be newly decoded. The procedure proceeds to S209.

In S209, the second decoding unit 204 decodes the loaded (k×b) words into the (k×L) second integers. The procedure proceeds to S210.

The n (=k×L) second integers are generated by the above-mentioned second decoding process S2003.

<Integer Combining Process S2004>

The integer combining unit 205 executes an integer combining process S2004 of generating the n integers, based on the n first integers 1021 and the n second integers 1022. The integer combining process S2004 includes processes in S210 to S212.

In S210, the integer combining unit 205 recombines each of the (k×L) first integers decoded by the first decoding unit 202 and a corresponding one of the (k×L) second integers decoded by the second decoding unit 204. The integer combining unit 205 recombines each of the (k×L) first integers and the corresponding one of the (k×L) second integers to generate the (k×L) integers. The procedure proceeds to S211.

In S211, the output unit 206 adds the n (=k×L) integers generated by the integer combining unit 205 to the original data 22. The procedure proceeds to S212.

In S212, the finish determination unit 203 sets a process to be subsequently performed to the first integer decoding process. This setting is used for the determination in S202. The procedure returns to S201.

The n (=k×L) integers are generated by the above-mentioned integer combining process S2004.

The description of the data decompression method or the data decompression process S200 of the data decompression apparatus 200 will be finished by the above description.

\*\*\*Description of Effects\*\*\*

The data compression apparatus according to this embodiment reversibly compresses a data series constituted from fixed-length integer value data having a word length of L bits. The encoding adjustment unit selects the multiple (k×L) of a word length L, as the n that is the number of integers to be encoded all at once. The first encoding unit generates a result of the encoding of (k×L) first integers determined by the encoding adjustment unit to be the multiple of the word length L. That is, the first encoding unit performs word-based compression. The second encoding unit packs n second integers determined by the encoding adjustment unit into (k×b) words, or (k×b×L) bits.

The data compression apparatus according to this embodiment includes the first encoded result output unit to output the result of the encoding generated by the first encoding unit with a length of the multiple of the word length L. The data compression apparatus includes the second encoded result output unit to output a result of the encoding generated by the second encoding unit with a length of the (k×b) words or the (k×b×L) bits.

In the data decompression apparatus according to this embodiment, the first integer decoding unit loads the compressed data word by word, and repeats a decoding process on the word basis, thereby decoding the compressed data into the first integers. The finish determination unit determines whether the (k×L) first integers have been decoded. If a result of the determination is true, transition is made to the process by the second decoding unit. The second decoding unit loads the compressed data on the word basis, and decodes the compressed data into the number of the second integers equal to the number of the first integers decoded by the first decoding unit. That is, the second decoding unit decodes the (k×b) words determined based on the bit dividing position parameter b and the number of the decoded first integers of the k into the (k×L) second integers.

The integer combining unit combines the results of outputs from the first decoding unit and the second decoding unit to obtain original (k×L) integer values.

According to the data compression apparatus in this embodiment, the high- and low-order bits division method may be adopted, and the result of encoding of the first integers constituted from high-order bits and the result of encoding of the second integers constituted from low-order bits may be both generated on the word basis. Accordingly, the data compression apparatus according to this embodiment may improve a processing speed while improving a compression ratio.

According to the data compression apparatus and the data decompression apparatus in this embodiment, the result of the first encoding and the result of the second encoding may be alternatively output by a small amount each. Therefore, according to the data compression apparatus, even if the encoding data 11 is data of an extremely great size, it is not necessary to load all the data all at once in a compression process. The data may be loaded by a small amount each and may be sequentially processed. Further, according to the data decompression apparatus, even if the encoded data 12 is data of an extremely great size, it is not necessary to load all the data all at once in a decompression process. The data may be loaded by a small amount each and may be sequentially processed.

Second Embodiment

In this embodiment, a difference from the first embodiment will be mainly described.

*Description of Configuration*

A block configuration illustrating a data compression apparatus 100a according to this embodiment is given by FIG. 1, as in the first embodiment. A block configuration illustrating a data decompression apparatus 200a according to this embodiment is given by FIG. 2, as in the first embodiment. Description of components that are the same as those described in the first embodiment may be omitted by giving same reference signs to them.

In the data compression apparatus 100a according to this embodiment, a function and an operation of the encoding adjustment unit 103 are different from those in the first embodiment. In this embodiment, the description will be given, assuming the encoding adjustment unit 103 and the determination unit 1031 in FIG. 1 as an encoding adjustment unit 103a and a determination unit 1031a, respectively.

The determination unit 1031a or the encoding adjustment unit 103a determines K, in which the K is a natural number, as an upper limit value of the k, and determines a parameter c, in which the c is a natural number. The encoding adjustment unit 103a selects the k that makes the number of excess bits which are to become redundant in encoding not more than the c when n first integers 1021 are encoded in a range of k≤K.

As mentioned above, the encoding adjustment unit 103a uses two parameters K and c in order to determine the n that is the number of the integers to be encoded all at once. Specifically, the encoding adjustment unit 103a selects the multiple (K×L) of the word length L as the upper limit of the number of the integers to be encoded all at once. Further, the encoding adjustment unit 103a selects a minimum k that makes the number of excess bits which are to become redundant in encoding not more than the bits defined by the preset parameter c when the (k×L) first integers are encoded in the range of k<K.

In the data decompression apparatus 200a according to this embodiment, a function and an operation of the first decoding unit 202 are different from those in the first embodiment. In this embodiment, the description will be given, assuming the finish determination unit 203 and the first decoding process unit 2021 of the first decoding unit 202 in FIG. 2 as a finish determination unit 203a and a first decoding process unit 2021a of a first decoding unit 202a, respectively.

The finish determination unit 203a determines, as the upper limit value of the k, the K in which the K is the natural number, and determines the parameter c in which the c is the natural number. The finish determination unit 203a uses the two parameters K and c in order to determine whether or not a first integer decoding process has been completed.

*Description of Operations*

Figure 6:
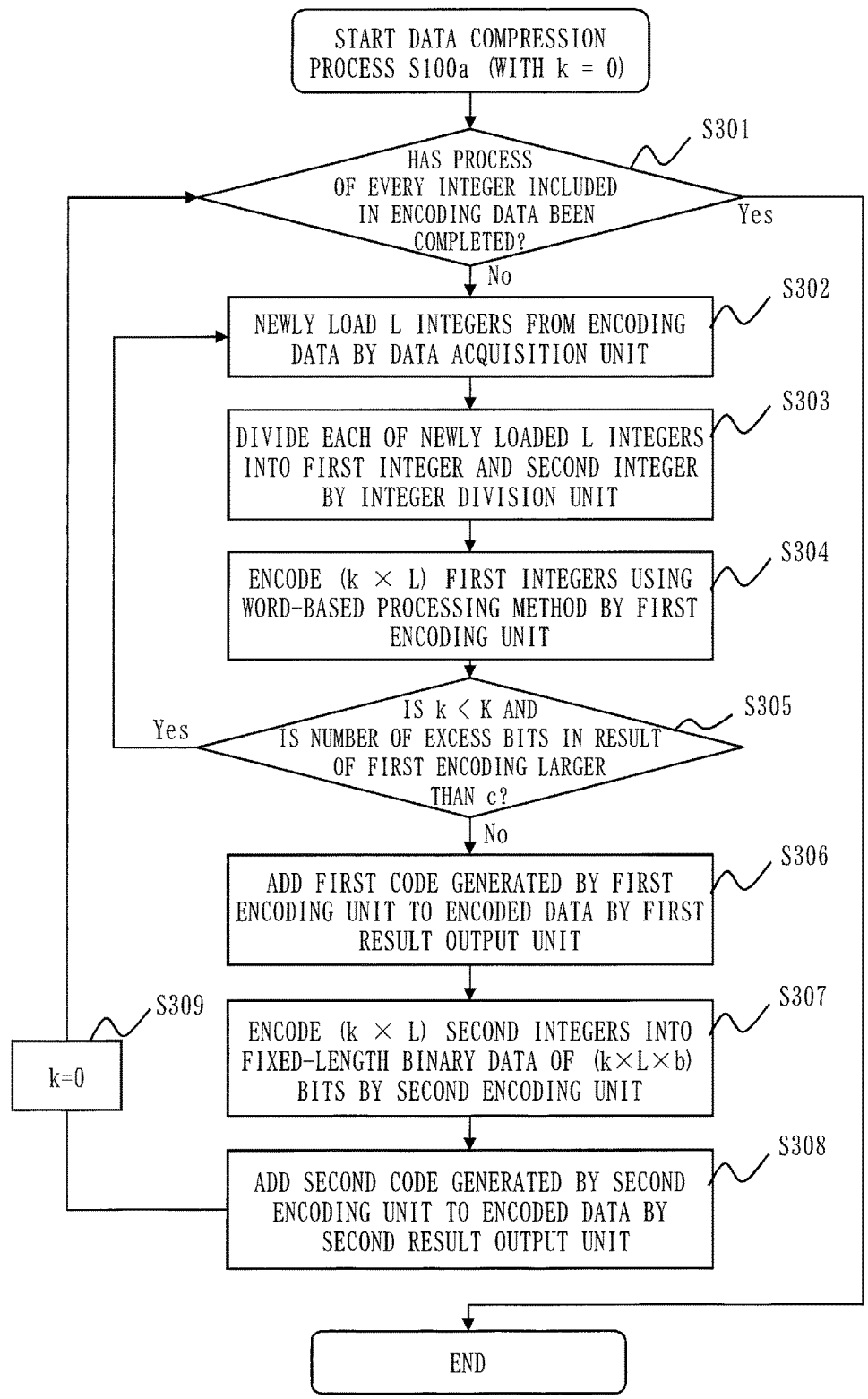
FIG. 6 is a flow diagram of a data compression method or a data compression process of a data compression apparatus according to a second embodiment.

A data compression method or a data compression process S100a of the data compression apparatus 100a according to this embodiment will be described, using FIG. 6.

The data compression apparatus 100a initializes the parameter k to 0 when the data compression process S100a is started.

Figure 4:
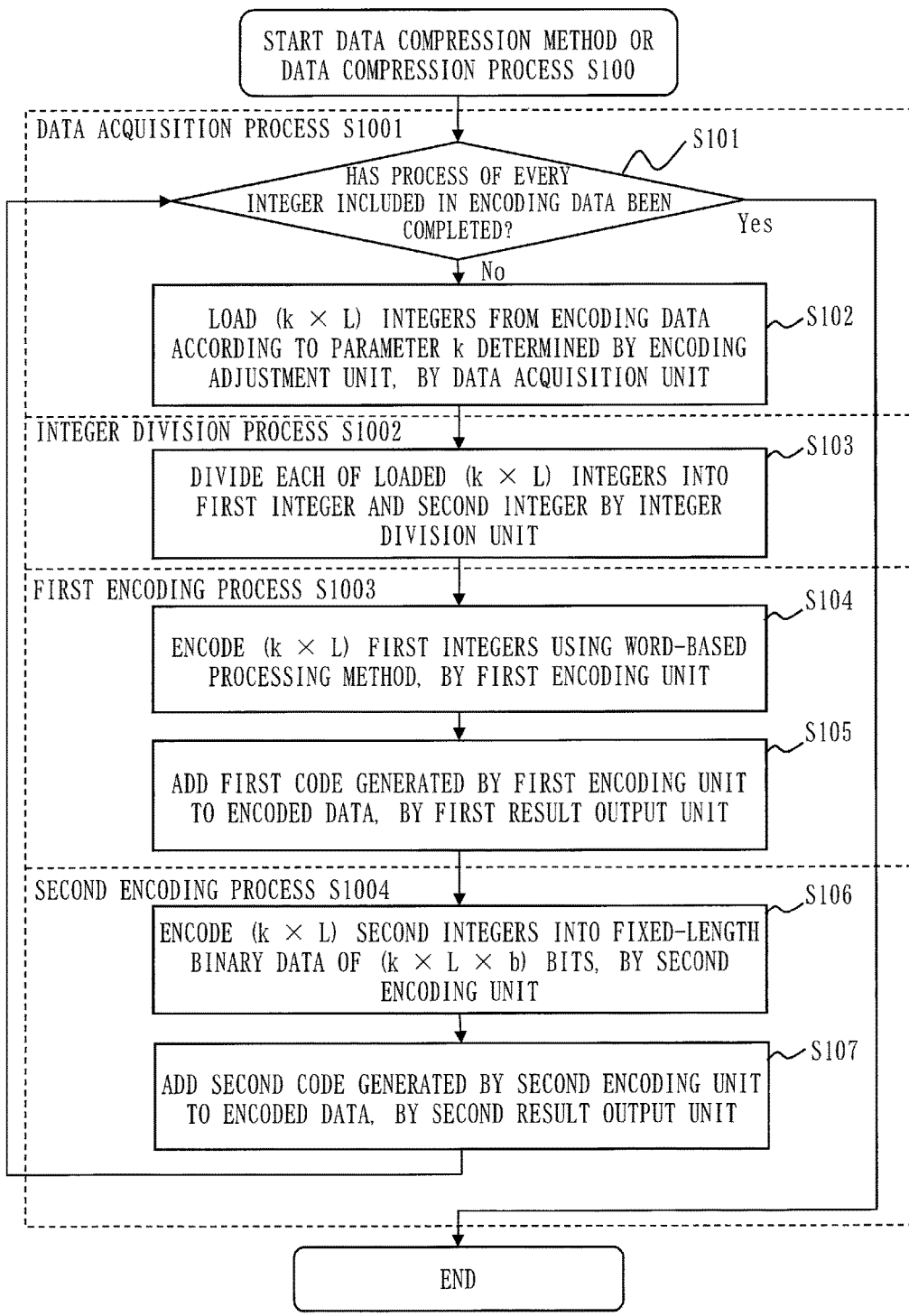
FIG. 4 is a flow diagram of a data compression method or a data compression process of the data compression apparatus according to the first embodiment.

A process in S301 is the same as the process in S101 in FIG. 4. That is, in S301, the data acquisition unit 101 determines whether an encoding process of every integer included in encoding data 11 has been completed.

If the data acquisition unit 101 has determined that the encoding process of the every integer included in the encoding data 11 has been completed, the procedure is finished. If the data acquisition unit 101 has determined that the encoding process of the every integer included in the encoding data 11 has not been completed, the procedure proceeds to S302.

In S302, the data acquisition unit 101 newly loads L integers from the encoding data 11. If only the integers less than the L integers remain in the encoding data 11, the data acquisition unit 101 loads all of the integers. The data acquisition unit 101 increments the parameter k. As mentioned above, the initial value of the k is 0. The process in S302 corresponds to the process in S102 in FIG. 4. The procedure proceeds to S303.

In S303, the integer division unit 102 divides each of the loaded L integers into a first integer 1021 constituted from high-order bits of (L−b) bits and a second integer 1022 constituted from low-order bits of b bits. The process in S303 corresponds to the process in S103 in FIG. 4. The procedure proceeds to S304.

In S304, the first encoding unit 104 encodes (k×L) first integers 1021, using the word-based processing method to generate a first code 1041. The process in S304 corresponds to the process in S104 in FIG. 4. The procedure proceeds to S305.

In S305, the encoding adjustment unit 103a determines whether or not the number of the integers of the n to be compressed all at once should be set to the (k×L). If k<K holds and the number of excess bits in a result of the first encoding in S304 is larger than the c, the encoding adjustment unit 103a determines that n=(k×L) should not be set. The procedure then returns to S302. If k<K does not hold or the number of excess bits in the result of the first encoding in S304 is not larger than the c, the encoding adjustment unit 103a determines that n=(k×L) should be set. The procedure then proceeds to S306. The excess bits will be described later.

In S306, the first result output unit 105 adds the first code 1041 generated by the first encoding unit 104 to encoded data 12. The process in S306 corresponds to the process in S105 in FIG. 4. The procedure proceeds to S307.

In S307, the second encoding unit 106 encodes (k×L) second integers into fixed-length binary data of (k×L×b) bits to generate a second code 1061. The process in S307 corresponds to the process in S106 in FIG. 4. The procedure proceeds to S308.

In S308, the second result output unit 107 adds the second code 1061 generated by the second encoding unit 106 to the encoded data 12. The process in S308 corresponds to the process in S107 in FIG. 4. The procedure proceeds to S309.

In S309, the second result output unit 107 initializes the parameter k to 0, and the procedure returns to S301.

The description of the data compression process S100a of the data compression apparatus 100a is finished by the above description.

As mentioned above, by the operations of the data compression apparatus 100a, the encoding adjustment unit 103a may select the optimal k within the range not more than the parameter K that has been given, which is different from the first embodiment. The smaller the value of k is, the more the processing speed of the data compression process improves, but the compression ratio of the data compression process is reduced. However, by operating the encoding adjustment unit 103a as illustrated in FIG. 6, it becomes possible to select the minimum k while maintaining a state where the compression ratio increases to a certain level. Accordingly, high performance is maintained with respect to both of the compression ratio and the processing speed.

Herein, the excess bits that will play an important role in the operation of the encoding adjustment unit 103a will be described, using Simple9 as an example.

Assume, for example, that an integer string to be encoded is constituted from three integers of 1 (1), 5 (101), and 3 (11). Each of the integers in parentheses is represented by binary number(s). In this case, the largest one of the integers is 5, and the number of binary digits of 5 is 3. Accordingly, when Simple 9 is used, a compression ratio is naturally improved most by selection of the data encoding method that can pack 9 binary integers of three digits. However, in the above example of the integer string, there are only three integers to be encoded. Thus, the method of packing 3 binary integers of 9 digits is actually selected as the encoding method though the maximum number of digits is 3. As mentioned above, there is a constraint that an output code be generated on the word basis because the word-based processing method is adopted. Thus, a redundant bit that would originally be unnecessary may be added. Such a redundant bit is referred to as an excess bit. In the above-mentioned example of the integer string, three numerical values of three digits are to be used. Thus, data that may be originally represented by 9 bits is represented by using 27 bits as three numerical values of 9 digits. Thus, excess bits are 18 bits.

A factor for generation of excess bit(s) is that integers to be encoded are not sufficient. In order to reduce the excess bit(s), the number of the integers to be encoded all at once should be increased. It may be interpreted that, based on this concept, the encoding adjustment unit 103a in this embodiment increases the number of integers to be encoded all at once to perform encoding again when the number of excess bits exceeds a certain threshold (parameter c).

Figure 7:
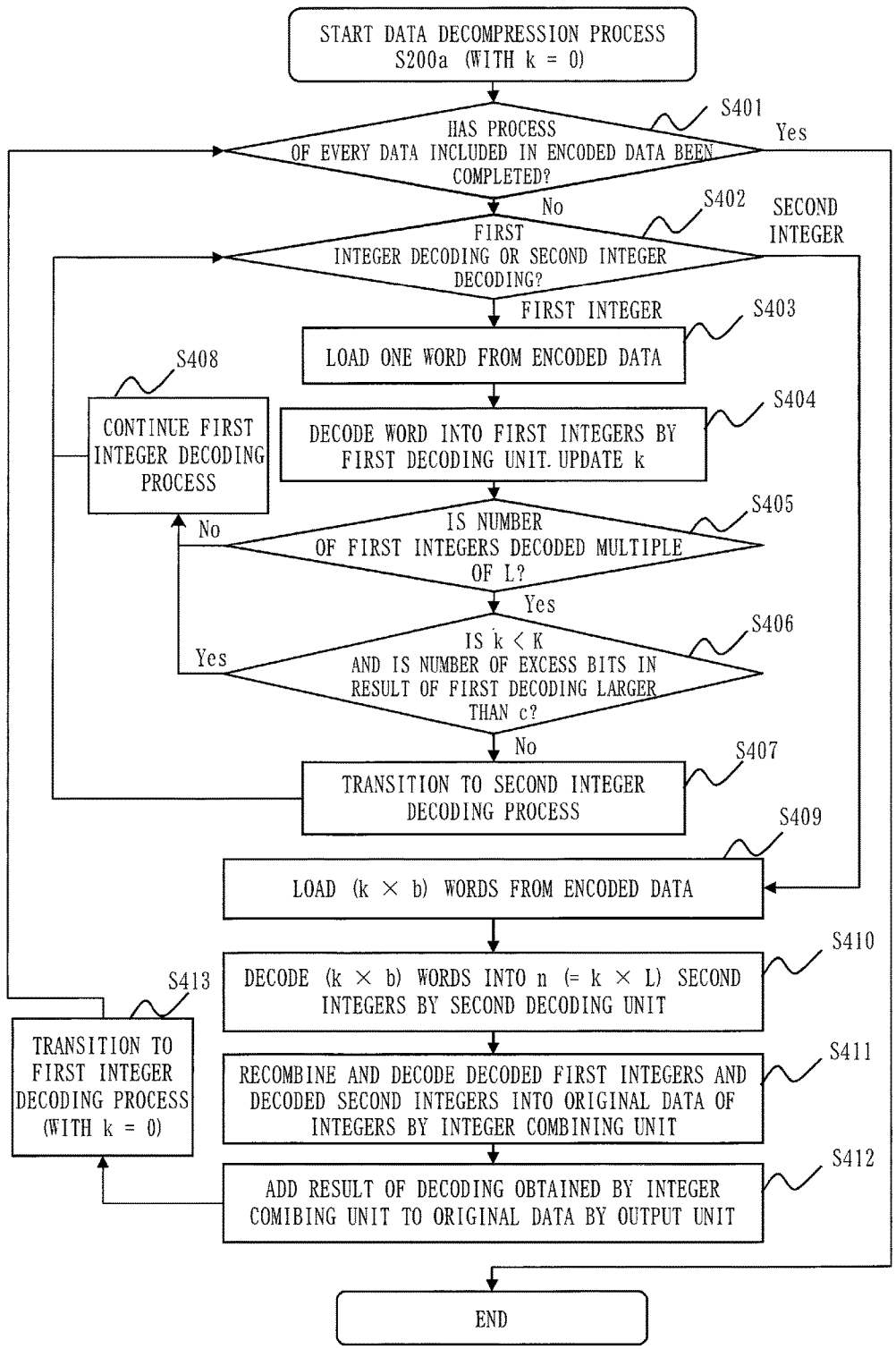
FIG. 7 is a flow diagram of a data decompression method or a data decompression process of a data decompression apparatus according to the second embodiment.
Figure 8:
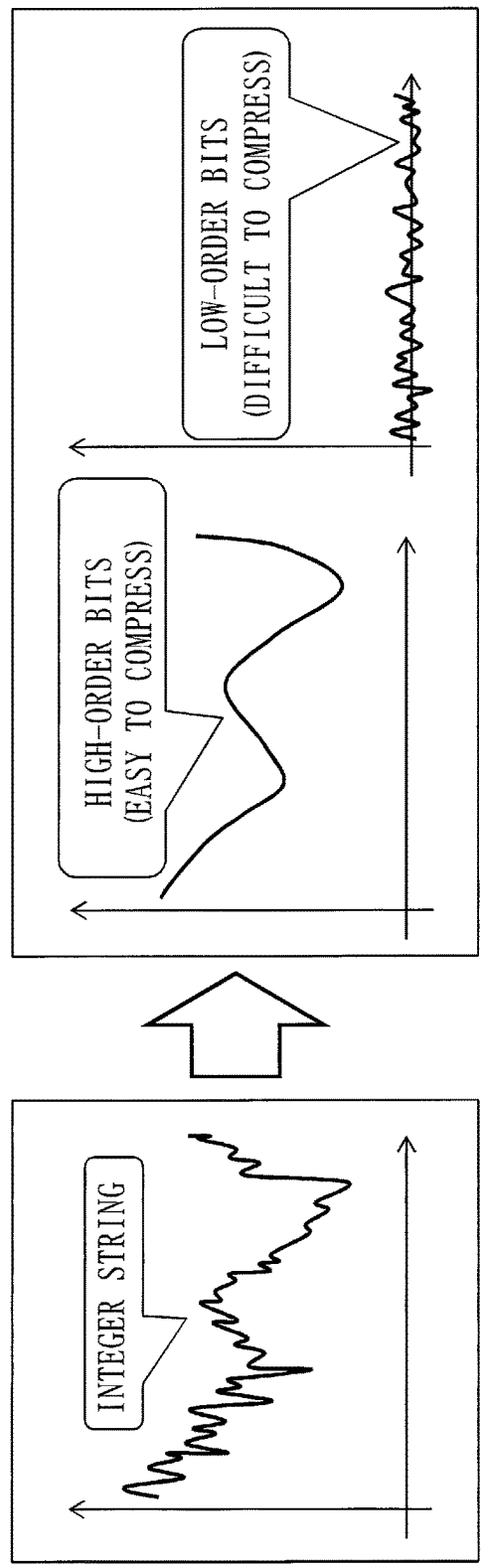
FIG. 8 is an explanatory diagram about division of bits of an integer string.

Subsequently, a data decompression method or a data decompression process S200a of the data decompression apparatus 200a according to this embodiment will be described, using FIG. 7.

The data decompression apparatus 200a initializes the parameter k to 0 when the data decompression process S200a is started.

Figure 5:
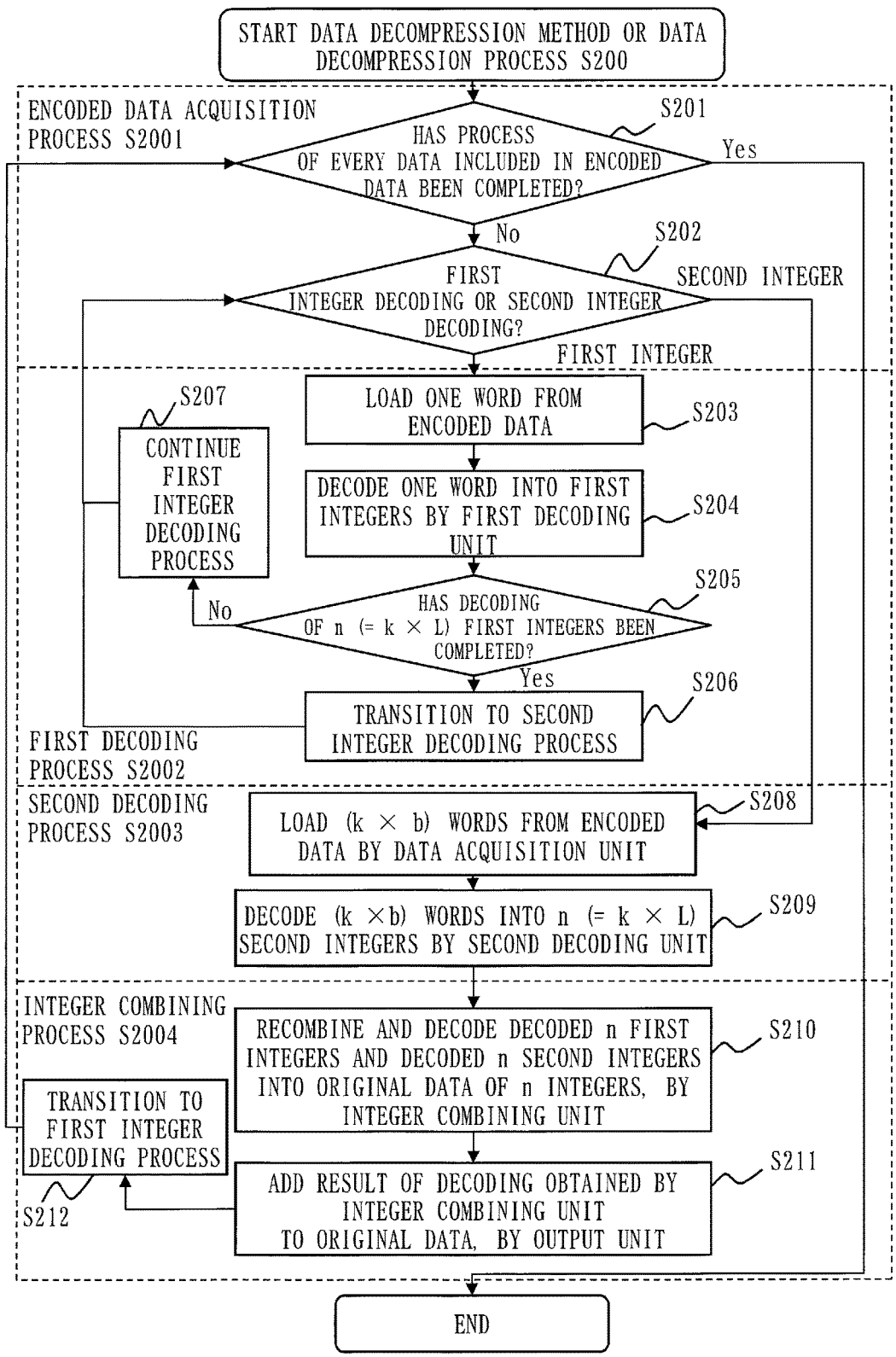
FIG. 5 is a flow diagram of a data decompression method or a data decompression process of the data decompression apparatus according to the first embodiment.

A process in S401 is the same as the process in S201 in FIG. 5. That is, in S401, the encoded data acquisition unit 201 determines whether a decoding process of every integer included in the encoded data 12 has been completed.

If the encoded data acquisition unit 201 has determined that the decoding process of the every integer included in the encoded data 12 has been completed, the procedure is finished. If the encoded data acquisition unit 201 has determined that the decoding process of the every integer included in the encoded data 12 has not been completed, the procedure proceeds to S402.

A process in S402 is the same as the process in S202 in FIG. 5. That is, in S402, the encoded data acquisition unit 201 determines whether a subsequent process is a first integer decoding process or a second integer decoding process. The initial state of the data decompression process S200a is the first integer decoding process. If the subsequent process is the first integer decoding process, the procedure proceeds to S403. If the subsequent process is the second integer decoding process, the procedure proceeds to S409.

Now, an overview of processes in S 403 to S 408 will be described. The first decoding unit 202a sequentially acquires, from the first code 1041, first unit data 10411 that is binary data whose unit bits is the L and decodes the first unit data 10411 acquired. The first decoding unit 202a selects the k that makes the number of excess bits which are to become redundant in decoding not more than the c and that makes the number of the first integers 1021 obtained by the decoding equal to a product between the k and the number of unit bits of the L when the first unit data 10411 is decoded in the range of k<K, or the k that becomes equal to the K. The first decoding unit 202a repeats the process of acquiring the first unit data 10411 from the first code 1041 and decoding the acquired first unit data 10411 until the number of the first integers 1021 obtained by the decoding becomes equal to the product between the number of unit bits of the L and the k. If k=K has held before the number of the first integers 1021 obtained by the decoding becomes equal to the product between the number of unit bits of the L and the k, the first decoding unit 202a selects the K as the k.

A process in S403 is the same as the process in S203 in FIG. 5. That is, in S403, the encoded data acquisition unit 201 loads from the encoded data 12 the one word of the data to be newly decoded. The one word is constituted from L bits. The procedure proceeds to S404.

In S404, the first decoding process unit 2021a of the first decoding unit 202a decodes the loaded one word into a plurality of the first integers. Then, the first decoding process unit 2021a updates the value of the parameter k to a value obtained by dividing the number of the first integers whose decoding has been completed by the L. The initial value of the k is 0. The procedure proceeds to S405.

In S405, the first decoding process unit 2021a determines whether or not the number of the first integers whose decoding has been completed is the multiple of the L.

If the first decoding process unit 2021a determines that the number of the first integers whose decoding has been completed has not become the multiple of the L, the procedure proceeds to S408 because the first integer decoding has not been completed yet.

If the first decoding process unit 2021a determines that the number of the first integers whose decoding has been completed has become the multiple of the L, the procedure proceeds to S406 that is a subsequent determination process because the first integer decoding may have been completed.

In S406, if k<K holds and the number of the excess bits in a result of the first decoding obtained by the decoding in S404 is larger than the c, the finish determination unit 203a determines that the first integer decoding has been not completed yet, and the procedure proceeds to S408. Alternatively, if k≥K holds or the number of the excess bits in the result of the first decoding obtained by the decoding in S404 is not more than the c, the finish determination unit 203a determines that the first integer decoding has been completed, and the procedure proceeds to S407.

In S407, the finish determination unit 203a sets a subsequent process to the second integer decoding process. This setting is used for the determination in S402.

The finish determination unit 203a initializes the number of the first integers to be used for the determination in S405 or the number of the first integers whose decoding has been completed to 0. The procedure returns to S402. The process in S407 corresponds to the process in S206 in FIG. 5.

Processes in S409 to S412 are the same as the processes in S208 to S211.

In S413, the finish determination unit 203a sets a process to be subsequently performed to the first integer decoding process. This setting is used for the determination in S402. Further, the finish determination unit 203a initializes the parameter k to 0. The procedure returns to S401.

The description of the data decompression method of the data decompression apparatus 200a will be finished by the above description.

*Description of Effects*

As described above, the encoding adjustment unit of the data compression apparatus according to this embodiment selects the multiple (K×L) of the word length L, as the upper limit of the number of integers to be encoded all at once. Further, the encoding adjustment unit selects the minimum k that makes excess bit(s), which are to become redundant in encoding not more than c bits when (k×L) first integers are encoded in the range of k<K. Then, the encoding adjustment unit selects the multiple (k×L) of the word length L, as the number of integers to be encoded all at once. The first encoding unit generates a result of the encoding of the (k×L) first integers determined by the encoding adjustment unit to be the multiple of the word length L. The second encoding unit packs the number of second integers determined by the encoding adjustment unit into (k×b) words or (k×b×L bits).

The finish determination unit of the data decompression apparatus according to this embodiment makes determination of being true if excess bit(s) which are to become redundant in encoding has become not more than the c bits when the (k×L) first integers have been decoded in the range of k<K, or if k=K. The second decoding unit decodes the (k×b) words that are determined by the bit dividing position parameter b and the number of the decoded first integers of the k into (k×L) second integers. The integer combining unit obtains (k×L) integer values.

As mentioned above, by the operations of the data compression apparatus 100a, the encoding adjustment unit 103a may select the optimal k within the range not more than the parameter K that has been given, which is different from the first embodiment. Generally, the smaller the value of the k is, the more the processing speed improves, but the compression ratio is reduced. However, by operating the data compression apparatus 100a as described in this embodiment, it becomes possible to select the minimum k while maintaining a state where the compression ratio increases to a certain level. High performance with respect to both of the compression ratio and the processing speed may be therefore maintained.

In the above-mentioned embodiments, each of the data acquisition unit, the integer division unit, the encoding adjustment unit, the first encoding unit, the first result output unit, the second encoding unit, and the second result output unit constitutes the data compression apparatus as an independent functional block. Further, each of the encoded data acquisition unit, the first decoding process unit, the finish determination unit, the second decoding unit, the integer combining unit, and the output unit constitutes the data decompression apparatus as an independent functional block. Each of the data compression apparatus and the data decompression apparatus is not, however, limited to the configuration as mentioned above. An arbitrary configuration may be used for each of the data compression apparatus and the data decompression apparatus. The data acquisition unit, the integer division unit, the encoding adjustment unit, the first encoding unit, the first result output unit, the second encoding unit, and the second result output unit may be implemented as one functional block. The encoded data acquisition unit, the first decoding process unit, the finish determination unit, the second decoding unit, the integer combining unit, and the output unit may be implemented as one functional block. An arbitrary functional block may be used for each of the data compression apparatus and the data decompression apparatus if the functional block may implement the function(s) described in the above-mentioned embodiments. The data compression apparatus and the data decompression apparatus may be configured with these functional blocks using any other combination or an arbitrary block configuration.

The data compression apparatus and the data decompression apparatus each do not need to be one apparatus, and may be a data compression system and a data decompression system each of which is constituted from a plurality of apparatuses. Alternatively, one apparatus or one system including the data compression apparatus and the data decompression apparatus may be employed.

The description has been given about the first and second embodiments. A plurality of portions of these two embodiments may be combined to be carried out. Alternatively, one of these two embodiments may be partially carried out. Alternatively, these two embodiments may be wholly or partially carried out by any combination.

The above-mentioned embodiments are essentially preferable exemplifications, and do not intend to limit an application and an application range of the present invention. Various modifications are possible as necessary.

REFERENCE SIGNS LIST

11: encoding data, 12: encoded data, 22: original data, 100, 100a: data compression apparatus, 101: data acquisition unit, 102: integer division unit, 103, 103a: encoding adjustment unit, 104: first encoding unit, 105: first result output unit, 106: second encoding unit, 107: second result output unit, 200, 200a: data decompression apparatus, 201: encoded data acquisition unit, 202, 202a: first decoding unit, 203, 203a: finish determination unit, 204: second decoding unit, 205: integer combining unit, 206: output unit, 901: processor, 902: auxiliary storage device, 903: memory, 904: communication device, 905: input interface, 906: display interface, 907: input device, 908: display, 910: signal line, 911, 912: cable, 1021: first integer, 1022: second integer, 1031, 1031a: determination unit, 1041: first code, 1061: second code, 1201: storage unit, 2021, 2021a: first decoding process unit, 9041: receiver, 9042: transmitter, 10411: first unit data, 10611: second unit data, S100, S100a: data compression process, S1001: data acquisition process, S1002: integer division process, S1003: first encoding process, S1004: second encoding process, S200, S200a: data decompression process, S2001: encoded data acquisition process, S2002: first decoding process, S2003: second decoding process, S2004: integer combining process.

The invention claimed is:

1. A data compression apparatus comprising:
processing circuitry to:
 determine, as n, a number that is k times a number of unit bits being a number of bits for each process, wherein the k is a natural number;
 acquire n integers from encoding data including a plurality of integers each represented by binary data having the number of unit bits;
 divide each integer of the n integers acquired by the processing circuitry into a second integer represented by low-order bits having a number of divided bits and a first integer represented by high-order bits obtained by excluding the low-order bits from each integer of the n integers and output n first integers and n second integers;
 encode the n first integers output from the processing circuitry and output a result of the encoding of the n first integers as a first code represented by binary data having a number of bits that is a natural-number times the number of unit bits; and encode the n second integers output from the processing circuitry and output a result of the encoding of the n second integers as a second code represented by binary data having a number of bits obtained by multiplying the number of unit bits by a product between the number of divided bits and the k.

2. The data compression apparatus according to claim 1, comprising:
a memory to store the first code output by the processing circuitry and to successively store the second code output by the processing circuitry after the first code.

3. The data compression apparatus according to claim 1, wherein the processing circuitry determines K as an upper limit value of the k wherein the K is a natural number, determines a parameter c wherein the c is a natural number, and selects the k that makes a number of bits of excess bits not more than the c, the excess bits being to become redundant in encoding when the n first integers are encoded in a range of k<K.

4. A data decompression apparatus comprising:
processing circuitry to:
acquire the first code, from the encoded data obtained by the encoding by the data compression apparatus according to claim 1 and including the first code and the second code, and to decode the acquired first code into the n first integers;
acquire the second code from the encoded data and to decode the acquired second code into the n second integers; and
generate the n integers based on the n first integers and the n second integers.

5. The data decompression apparatus according to claim 4,
wherein the processing circuitry acquires, from the second code, a number of second unit data being binary data having a number of unit bits just corresponding to a number of the product between the number of divided bits and the k, and decodes the acquired number of second unit data corresponding to the number of the product between the number of divided bits and the k into the n second integers.

6. The data decompression apparatus according to claim 4,
wherein the processing circuitry sequentially acquires each first unit data being binary data having the number of unit bits, decodes the first unit data acquired, counts a number of the first integers obtained by the decoding, and repeats a process of acquiring the first unit data from the first code and decoding the acquired first unit data until the counted number becomes equal to the n.

7. The data decompression apparatus according to claim 4,
wherein the processing circuitry determines K as an upper limit value of the k wherein the K is a natural number and determines a parameter c wherein the c is a natural number, and
sequentially acquires each first unit data being binary data having the number of unit bits, decodes the first unit data acquired, selects the k that makes a number of excess bits not more than the c and makes a number of the first integers obtained by the decoding equal to a product between the number of unit bits and the k, or selects k=K, and repeats a process of acquiring the first unit data from the first code and decoding the acquired first unit data until the number becomes equal to the product between the number of unit bits and the k, the excess bits being to become redundant in decoding when the first unit data is decoded in a range of k<K.

8. A data compression method comprising:
determining, as n, a number that is k times a number of unit bits being a number of bits for each process, wherein the k is a natural number;
acquiring n integers from encoding data including a plurality of integers each represented by binary data having the number of unit bits, wherein n is a natural number;
dividing each integer of the n integers acquired by the processing circuitry into a second integer represented by low-order bits having a number of divided bits and a first integer represented by high-order bits obtained by excluding the low-order bits from each integer of the n integers and outputting n first integers and n second integers;
encoding the n first integers output from the processing circuitry and outputting a result of the encoding of the n first integers as a first code represented by binary data having a number of bits that is a natural-number times the number of unit bits; and
encoding the n second integers output from the processing circuitry and outputting a result of the encoding of the n second integers as a second code represented by binary data having a number of bits obtained by multiplying the number of unit bits by a product between the number of divided bits and the k.

9. A data decompression method comprising:
acquiring the first code included in encoded data obtained by the encoding by the data compression method according to claim 8 and including the first code and the second code, and decoding the acquired first code into the n first integers;
acquiring the second code from the encoded data and decoding the acquired second code into the n second integers; and
generating the n integers based on the n first integers and the n second integers.

10. A non-transitory computer readable medium storing a program to cause a computer to execute:
a determination process of determining, as n, a number that is k times a number of unit bits being a number of bits for each process, wherein the k is a natural number;
a data acquisition process of acquiring n integers from encoding data including a plurality of integers each represented by binary data having the number of unit bits, wherein n is a natural number;
an integer division process of dividing each integer of the n integers acquired by the data acquisition process into a second integer represented by low-order bits having a number of divided bits and a first integer represented by high-order bits obtained by excluding the low-order bits from each integer of the n integers and outputting n first integers and n second integers;
a first encoding process of encoding the n first integers output by the integer division process and outputting a result of the encoding of the n first integers as a first code represented by binary data having a number of bits that is a number of bits is natural-number times the number of unit bits; and
a second encoding process of encoding the n second integers output by the integer division process and outputting a result of the encoding of the n second integers as a second code represented by binary data having a number of bits obtained by multiplying the number of unit bits by a product between the number of divided bits and the k.

11. A non-transitory computer readable medium storing a program to cause a computer to execute:
   a first decoding process of acquiring the first code included in encoded data obtained by the encoding by the program according to claim 10 and including the first code and the second code and decoding the acquired first code into the n first integers;
   a second decoding process of acquiring the second code from the encoded data and decoding the acquired second code into the n second integers; and
   an integer combining process of generating the n integers based on the n first integers and the n second integers.

* * * * *

UNITED STATES PATENT AND TRADEMARK OFFICE
CERTIFICATE OF CORRECTION

PATENT NO. : 9,979,415 B2
APPLICATION NO. : 15/536030
DATED : May 22, 2018
INVENTOR(S) : Hideya Shibata It is certified that error appears in the above-identified patent and that said Letters Patent is hereby corrected as shown below:

On the Title Page

Item (54), please correct the title from:
"DATA COMPRESSION APPARATUS, DATA DECOMPRESSION APPARATUS, DATA COMPRESSION METHOD, DATA COMPRESSION METHOD, AND COMPUTER READABLE MEDIUM"
To:
--DATA COMPRESSION APPARATUS, DATA DECOMPRESSION APPARATUS, DATA COMPRESSION METHOD, DATA DECOMPRESSION METHOD, AND COMPUTER READABLE MEDIUM--.

Signed and Sealed this
Seventh Day of August, 2018

Andrei Iancu
*Director of the United States Patent and Trademark Office*